US012800623B2

(12) United States Patent
Kim et al.

(10) Patent No.: US 12,800,623 B2
(45) Date of Patent: Nov. 17, 2026

(54) POWER REGULATOR

(71) Applicant: AUTONICS CORPORATION, Busan (KR)

(72) Inventors: Byoung Soo Kim, Gwangmyeong-si (KR); Hee Sung Lee, Gimpo-si (KR)

(73) Assignee: AUTONICS CORPORATION, Busan (KR)

( * ) Notice: Subject to any disclaimer, the term of this patent is extended or adjusted under 35 U.S.C. 154(b) by 188 days.

(21) Appl. No.: 18/706,784

(22) PCT Filed: Nov. 3, 2022

(86) PCT No.: PCT/KR2022/017167
§ 371 (c)(1),
(2) Date: May 2, 2024

(87) PCT Pub. No.: WO2023/080686
PCT Pub. Date: May 11, 2023

(65) Prior Publication Data

US 2026/0153541 A1 Jun. 4, 2026

(30) Foreign Application Priority Data

Nov. 3, 2021 (KR) ........................ 10-2021-0149686

(51) Int. Cl.

| | |
|---|---|
| ***G01R 19/175*** | (2006.01) |
| ***G05F 1/66*** | (2006.01) |
| ***H02H 3/08*** | (2006.01) |
| ***H02M 1/08*** | (2006.01) |
| ***H02M 3/315*** | (2006.01) |

(52) U.S. Cl.
CPC ............. *G01R 19/175* (2013.01); *G05F 1/66* (2013.01); *H02H 3/08* (2013.01); *H02M 1/08* (2013.01); *H02M 3/315* (2013.01)

(58) Field of Classification Search
None
See application file for complete search history.

(56) References Cited

U.S. PATENT DOCUMENTS 10,693,452 B2 * 6/2020 Orozco ................ H03K 17/133

FOREIGN PATENT DOCUMENTS

CN 100557976 C 11/2009
CN 102594226 A * 7/2012

(Continued)

OTHER PUBLICATIONS

CN_102594226 translation (Year: 2012).*
JP_2019056659 translation (Year: 2019).*

*Primary Examiner* — Gary L Laxton
*Assistant Examiner* — Jennifer C Caulk
(74) *Attorney, Agent, or Firm* — Birch, Stewart, Kolasch & Birch, LLP

(57) ABSTRACT

A power regulator according to an embodiment of the present invention may comprise: a fuse module which includes first to third fuses, a thyristor module which includes first to third thyristors and controls power supplied to a load, a single-phase zero crossing detection unit which includes first to third photocouplers, a three-phase zero crossing detection unit which includes fourth to sixth photocouplers, and a switch unit which physically insulates the single-phase zero crossing detection unit and the three-phase zero crossing detection unit from each other.

8 Claims, 7 Drawing Sheets

(56) References Cited

FOREIGN PATENT DOCUMENTS

| | | | | |
|---|---|---|---|---|
| JP | 2019-56659 | A | | 4/2019 |
| JP | 2019056659 | A | * | 4/2019 |
| KR | 10-2005-0055830 | A | | 6/2005 |
| KR | 10-1126127 | B1 | | 3/2012 |
| KR | 10-1405244 | B1 | | 6/2014 |

* cited by examiner

PRIOR ART

PRIOR ART

POWER REGULATOR

CROSS REFERENCE TO RELATED APPLICATIONS

This application is the National Phase of PCT International Application No. PCT/KR2022/017167, filed on Nov. 3, 2022, which claims priority under 35 U.S.C. 119 (a) to Patent Application No. 10-2021-0149686, filed in the Republic of Korea on Nov. 3, 2021, all of which are hereby expressly incorporated by reference into the present application.

TECHNICAL FIELD

The present invention relates to a power regulator capable of controlling power supplied to a load.

BACKGROUND ART

A power regulator is a device that controls the amount of power supplied to a product using a semiconductor device called a thyristor.

Methods for controlling the amount of power in the power regulator include a phase control method and a cycle control method.

The phase control method is a method that proportionally controls a phase angle according to a control input in half-cycles of an AC sine wave.

The cycle control method is a method of controlling the switching operation of a semiconductor device at the zero-crossing point of an AC sine wave.

Measuring the zero crossing point is important to regulate the power of the load. In the prior art, there were a single-phase zero crossing detection circuit for detecting a single-phase zero crossing and a three-phase zero crossing detection circuit for detecting a three-phase zero crossing.

When only one of the single-phase zero crossing detection circuit and the three-phase zero crossing detection circuit is used, management is difficult and each must be provided in a separate power regulator, which causes problems such as space inefficiency and increased cost.

DISCLOSURE OF INVENTION

Technical Problem

The purpose of the present invention is to detect a zero crossing using an integrated circuit in which a single-phase zero crossing detection circuit and a three-phase zero crossing detection circuit are integrated.

The purpose of the present invention is to accurately detect a fuse blowing when an integrated circuit is used as a single phase.

Technical Solution

A power regulator according to an embodiment of the present invention may include a fuse module which includes first to third fuses, a thyristor module which includes first to third thyristors and controls power supplied to a load; a single-phase zero crossing detection unit which includes first to third photocouplers, a three-phase zero crossing detection unit which includes fourth to sixth photocouplers, and a switch unit which physically insulates the single-phase zero crossing detection unit and the three-phase zero crossing detection unit from each other.

Advantageous Effects

According to various embodiments of the present invention, frequency measurement errors may be fundamentally prevented by physically insulating three-phase/single-phase frequency detection circuits using a switching design structure.

Additionally, it is possible to generate an accurate alarm due to a blown fuse when a product is used as a single phase.

Since an alarm can now be generated for a blown fuse, immediate response is possible through quick recognition in the event of a fuse blowing during use.

Just a single product can be applied to both three-phase and single-phase power systems, improving product fluidity.

By simplifying the product series and the unit cost of the product can be reduced according to the optimal design structure.

BEST MODE FOR CARRYING OUT THE INVENTION

Hereinafter, embodiments of the present disclosure will be described in detail with reference to the drawings. The suffixes "module" and "unit or portion" for components used in the following description are merely provided only for facilitation of preparing this specification, and thus they are not granted a specific meaning or function.

hereinafter, zero crossing refers to a state in which no voltage is applied to a specific terminal, that is, a state in which voltage is zero. A zero crossing point may represent a point where voltage is zero.

The zero crossing point is used to detect a frequency, and based on detecting the frequency, power control may be achieved.

Figure 1:
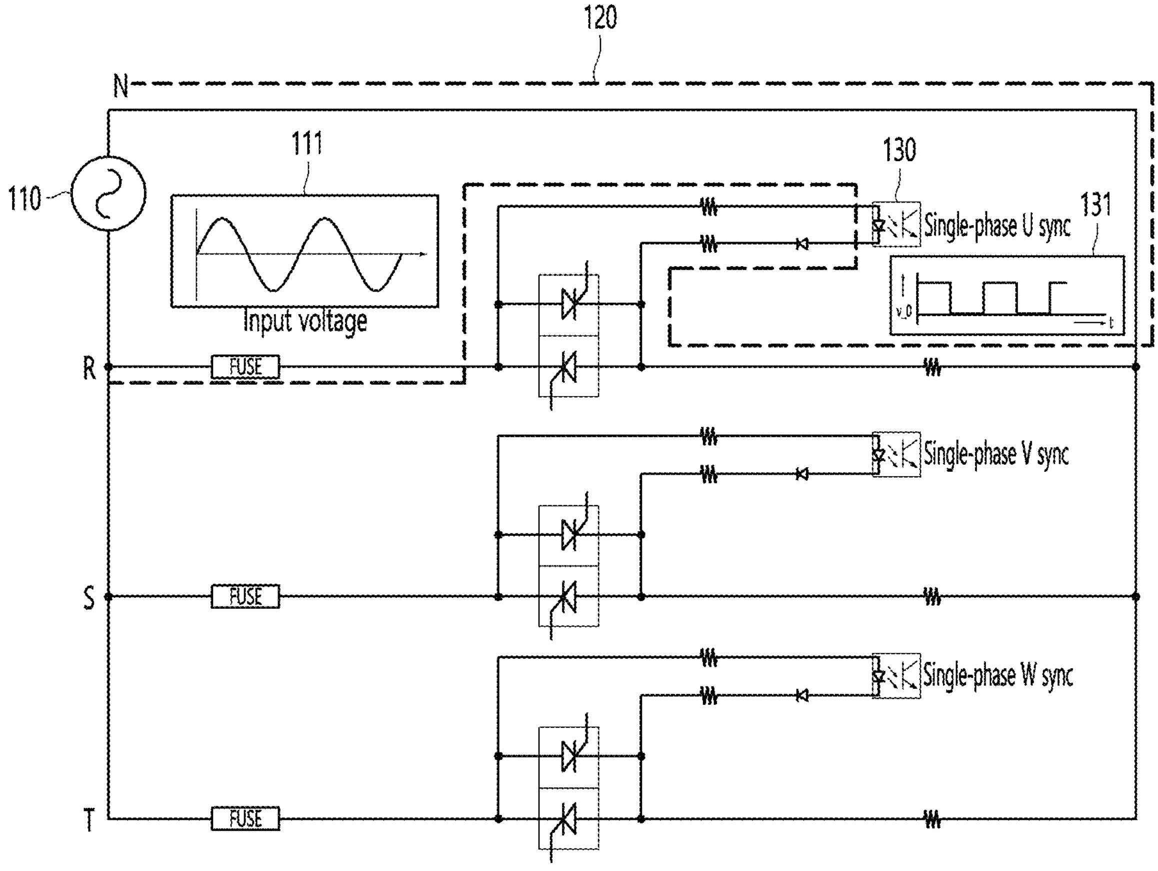
FIG. 1 is a diagram for describing a configuration of a circuit for single-phase zero crossing detection according to the prior art.

FIG. 1 is a diagram for describing a configuration of a circuit for single-phase zero crossing detection according to the prior art.

Referring to FIG. 1, an AC power supply 110 may input an AC signal 111 in the form of a sine wave into an R phase and an N (neutral) phase. The AC signal 111 is an alternating voltage signal.

When the AC signal 111 is input, a current loop 120 is formed, as shown in FIG. 1.

When the current loop 120 is formed, the diode constituting the photo coupler 130 is turned on when the AC signal is in the forward direction, and the diode is turned off when the AC signal is in the reverse direction, so that an output signal (131) is generated.

The generated output signal 131 may be transferred to the secondary circuit. A control part may use the output signal 131 as a reference signal for phase control or cycle control of the AC sine wave, or to detect a frequency.

Figure 2:
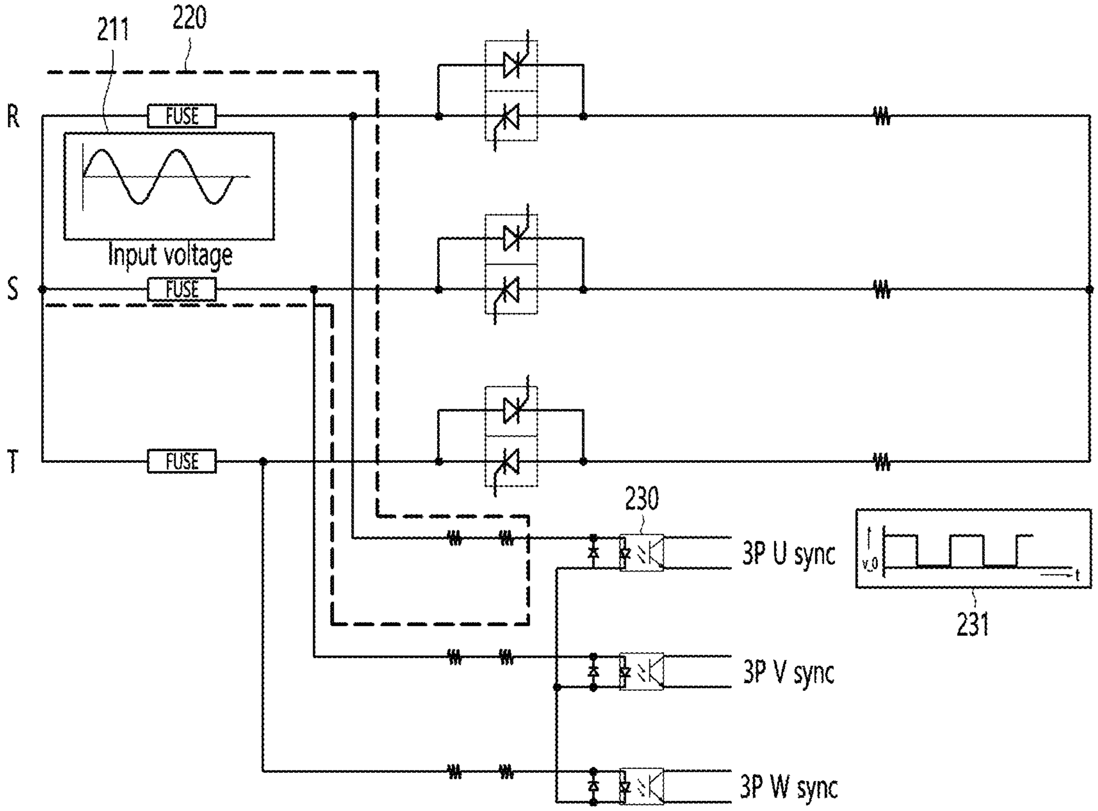
FIG. 2 is a diagram for describing a configuration of a circuit for three-phase zero crossing detection according to the prior art.

FIG. 2 is a diagram for describing a configuration of a circuit for three-phase zero crossing detection according to the prior art.

Referring to FIG. 2, when AC power is input, an AC signal 211 may be input to the R phase and S phase. The AC signal 211 is an alternating voltage signal.

When the AC signal 211 is input to the R phase and the S phase, a current loop 220 is formed, as shown in FIG. 2.

When the current loop 220 is formed, the photo coupler 230 generates an output signal 231 as a diode constituting the photo coupler 230 is turned on when the AC signal is in the forward direction and the diode is turned off when the AC signal is in the reverse direction.

The generated output signal 131 may be transferred to the secondary circuit. A control part may use the output signal 231 as a reference signal for phase control or cycle control of the AC sine wave, or to detect a frequency.

As shown in FIG. 1 or FIG. 2, the single-phase zero crossing detection circuit and the three-phase zero crossing detection circuit cannot flexibly respond to situations in which single phase or three phase need to be used according to individual field conditions.

Accordingly, the present disclosure applies a single-phase/three-phase zero crossing detection integrated circuit for flexible response to individual field conditions.

The single-phase/three-phase zero crossing detection integrated circuit may respond to customized for use with parameter settings to suit individual field conditions.

Figure 3:
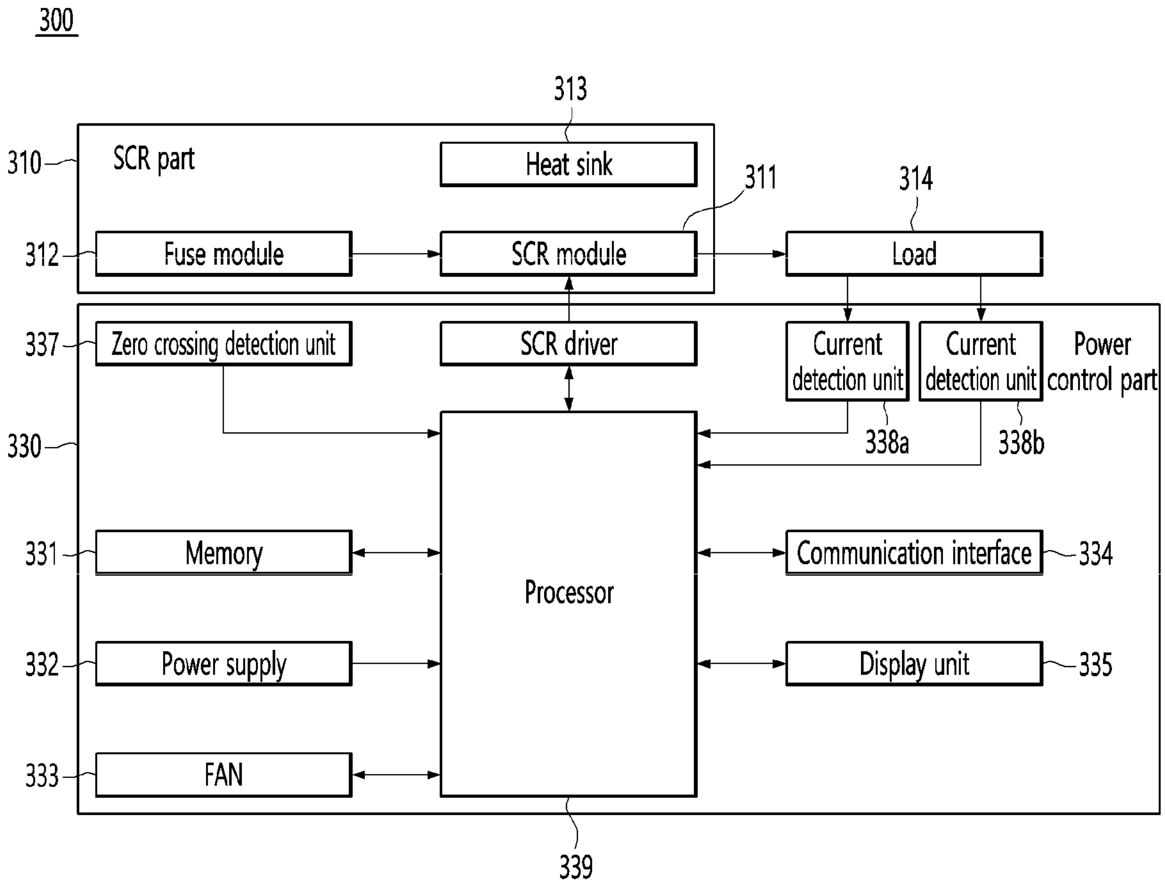
FIG. 3 is a block diagram for describing a power regulator according to an embodiment of the present disclosure.

FIG. 3 is a block diagram for describing a power regulator according to an embodiment of the present disclosure.

Referring to FIG. 3, a power regulator 300 may include an SCR (Silicon Controlled Rectifier) part 310 and a power control part 330.

The SCR part 310 may include an SCR module 311, a fuse module 312, and a heat sink 313.

The SCR module 311 may be a semiconductor module for power control. The SCR module 311 may include a plurality of semiconductor modules. Each of the semiconductor modules may be a thyristor.

The fuse module 312 may protect the power regulator 300 from overcurrent or overvoltage. The fuse module 312 serves to block current when overcurrent flows.

The heat sink 313 may absorb heat caused by the SCR module 311 and dissipate the absorbed heat.

The power control part 330 may include a memory 331, a power supply 332, a FAN 333, a communication interface 334, a display unit 335, an SCR driver 336, a zero crossing detection circuit 337, a voltage detector **338*a*, a current detector 338*b*, and a processor 339**.

The memory 331 may store information necessary for controlling power supplied to a load.

The power supply 332 may supply power required to drive the power control part 330.

The FAN 333 may lower the temperature of the power control part 330 using air. The FAN 333 may transfer heat caused by the processor 339 to the heat sink 313 and discharge the heat into the atmosphere.

The communication interface 334 may communicate with an external device. The communication interface 334 may exchange data with the external device through the USB (Universal Serial Bus) standard, RS485 standard, or EtherCAT standard.

The display unit 335 may display information related to power control. The display unit 335 may include one or more LCD modules.

The display unit 335 may output an abnormal state of a fuse. The display unit 335 may output an abnormality notification indicating that a specific fuse has been short-circuited.

The SCR driver 336 may generate a driver signal to control the operation of the SCR module 311 and transmit the generated driver signal to the SCR module 311.

The driver signal may be a signal for controlling the switching operation of the SCR module 311.

The zero crossing detection circuit 337 may include a plurality of photo couplers.

The photo coupler may include a light emitting element and an insulated light receiving element. The light emitting element may transfer an input electrical signal to the insulated light receiving element through light.

When a current loop is formed, the photo coupler may generate an output signal according to the direction of an AC signal. The zero crossing point may be detected through the output signal.

A voltage detector **338*a* may detect a voltage across the load 334 and transmit the detected voltage to the processor 339**.

A current detector **338*b* may detect a current across the load 334 and transmit the detected current to the processor 339. The current detector 338*b*** may be configured with a CT (Current Transformer).

The processor 339 may control the overall operation of the power control part 330.

The processor 339 may detect a zero crossing point based on a digital output signal received from the zero crossing detection circuit 337. The processor 339 may perform phase control or cycle control using the zero crossing point. Accordingly, the amount of power supplied to the load 314 may be controlled.

The processor 339 may receive a fuse abnormality alarm when the fuse module 312 is blown. The processor 339 may display the fuse abnormality alarm through the display unit 335.

Figure 4:
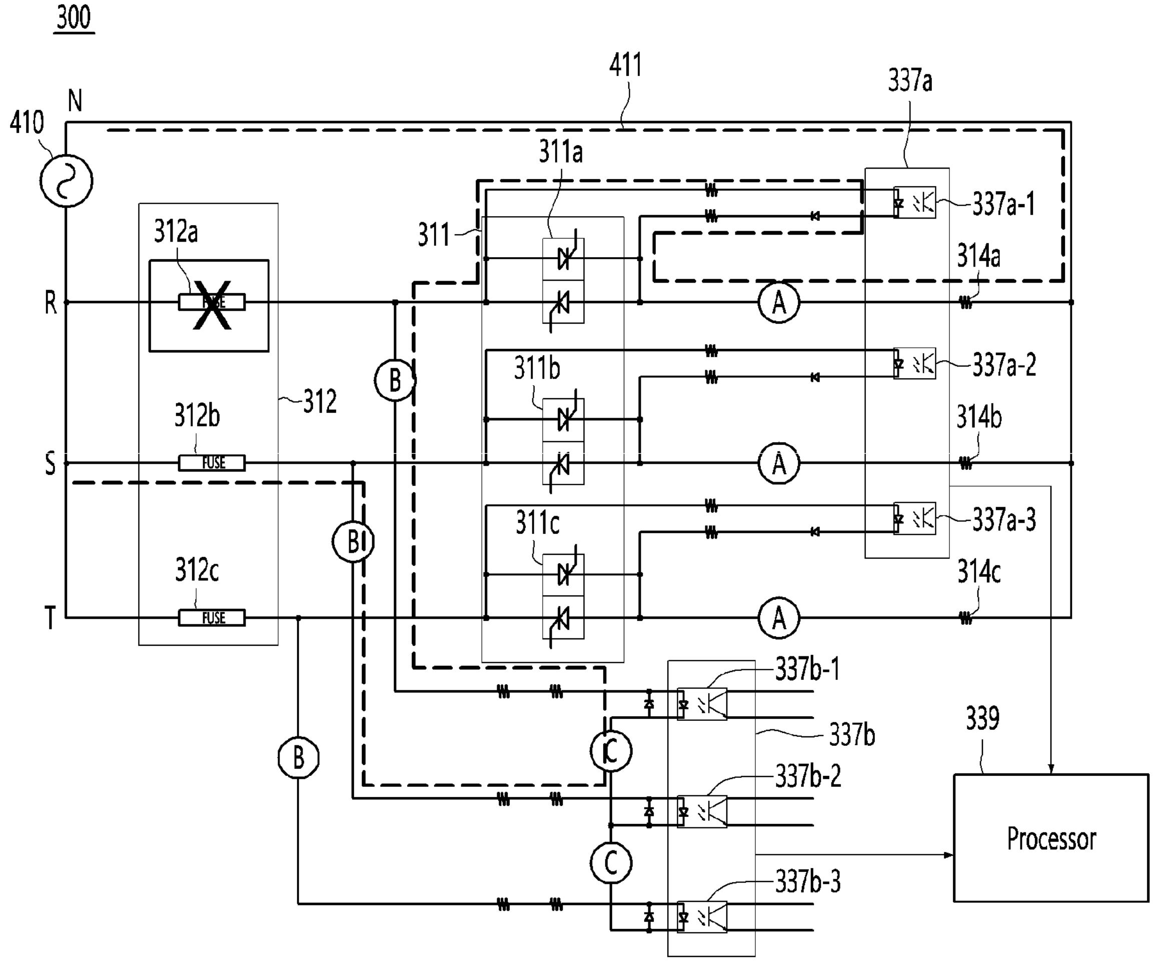
FIG. 4 is a block diagram illustrating a configuration of a power regulator according to an embodiment of the present disclosure.

FIG. 4 is a circuit diagram illustrating the configuration of a power regulator according to an embodiment of the present invention.

In FIG. 4, the SCR module 311, the fuse module 312, and the zero crossing detection circuit 337 are shown among the components of the power regulator 300 shown in FIG. 3.

In particular, FIG. 4 may be an integrated circuit of the circuit for single-phase zero crossing detection of FIG. 1 and the circuit for three-phase zero crossing detection of FIG. 2.

The power regulator 300 of FIG. 4 may operate in a single-phase zero crossing detection mode or a three-phase zero crossing detection mode according to parameter settings.

The single-phase zero crossing detection mode may be a mode for detecting a zero crossing when the power regulator 300 is used as a single phase, and the three-phase zero crossing detection mode may be a mode for detecting a three-phase zero crossing when the power regulator 300 is used as a three phase.

Referring to FIG. 4, the power regulator 300 may include an input power supply 410 that provides input power, the SCR module 311, the single-phase zero crossing detection unit 337*a*, the three-phase zero crossing detection unit 337*b*, the fuse module 312, and the processor 339.

The SCR module 311 may include a first SCR 311*a* corresponding to the R phase, a second SCR 311*b* corresponding to the S phase, and a third SCR 311*c* corresponding to the T phase.

SCR may be referred to as a thyristor.

The SCR module 311 may control the power supplied to the load 314 through a switching operation. A first SCR 311*a* may control power supplied to an R-phase load 314*a* through a switching operation, a second SCR 311*b* may control power supplied to an S-phase load 314*b* through a switching operation, and a third SCR 311*c* may control power supplied to a T-phase load 314*c* through a switching operation.

The SCR module 311 may receive a control signal from the SCR driver 336 and perform a switching operation according to the received control signal.

The single-phase zero crossing detection unit 337*a* may include a first photo coupler 337*a*-1, a second photo coupler 337*a*-2, and a third photo coupler 337*a*-3.

Each of the first photo coupler 337*a*-1, the second photo coupler 337*a*-2, and the third photo coupler 337*a*-3 may output a single-phase frequency signal under a single-phase zero crossing detection mode.

Specifically, each of the first photo coupler 337*a*-1, the second photo coupler 337*a*-2, and the third photo coupler 337*a*-3 may convert a single-phase high voltage AC signal input in the form of AC into a low voltage digital signal and output the low-voltage digital signal.

The output low-voltage digital signal may be transmitted to the processor 339.

The processor 339 may detect a single-phase zero crossing (phase value) where voltage is zero. The processor 339 may regulate the amount of power supplied to the load 314 according to a phase control method or a cycle control method based on the detected zero cross.

The three-phase zero crossing detection unit 337*b* may include a fourth photo coupler 337*b*-1, a fifth photo coupler 337*b*-2, and a sixth photo coupler 337*b*-3.

Under the three-phase zero crossing detection mode, each of the fourth photo coupler 337*b*-1, the fifth photo coupler 337*b*-2, and the sixth photo coupler 337*b*-3 may output a three-phase frequency signal.

Specifically, each of the fourth photo coupler (337*b*-1), the fifth photo coupler (337*b*-2), and the sixth photo coupler (337*b*-3) may convert a three-phase high voltage AC signal input in the form of AC form into a low voltage digital signal and output the low voltage digital signal.

The processor 339 may detect a three-phase zero crossing (phase value) where voltage is zero. The processor 339 may regulate the amount of power supplied to the load 314 according to a phase control method or a cycle control method based on the detected zero cross.

The fuse module 312 may include an R-phase fuse 312*a* corresponding to the R-phase, an S-phase fuse 312*b* corresponding to the S-phase, and a T-phase fuse 312*c* corresponding to the T-phase.

Under the single-phase zero crossing detection mode, a current loop 411 may be formed, as shown in FIG. 4, to detect the zero crossing of the R-phase.

However, in the case of the current loop 411, there is a problem in which an alarm is not generated even if the R-phase fuse 312*a* is blown because the R-phase low-voltage digital signal output from the first photo coupler 337*a*-1 is output.

That is, when the R-phase low-voltage digital signal is detected, the processor 339 does not output a fuse abnormality alarm.

Therefore, there is a problem in that the processor 339 cannot determine the abnormal state of the R-phase fuse 312*a* even if the R-phase fuse 312*a* is blown.

To this end, according to an embodiment of the present invention, a switch may be added at a position where the current loop 411 is formed.

In a single-phase/three-phase integrated circuit, the point capable of interrupting the formation of a current loop may be any of point A, point B, or point C.

That is, according to an embodiment of the present invention, a switch may be installed at point A.

When a switch unit is installed at point A, the switch unit includes first to third switches.

One end of the first switch may be connected to one end of the first thyristor 311*a*, and the other end of the first switch may be connected to one end of the R-phase load 314*a*.

One end of the second switch may be connected to one end of the second thyristor 311*b*, and the other end of the second switch may be connected to one end of the S-phase load 314*b*.

One end of the third switch may be connected to one end of the third thyristor 311*c*, and the other end of the third switch may be connected to the T-phase load 314*c*.

Because point A is a point where high voltage is applied or high current flows, the size of the switch needs to be large, making design difficult.

Therefore, according to another embodiment of the present invention, a switch may be installed at point B. In this case, three switches are needed. When the switch is installed at point B, point B is not a point where high voltage is applied or high current flows, so that there is the effect of escaping from the size constraints of the switch and making design easier.

In another embodiment of the present invention, a switch may be installed at point C. In this case, compared to the case where the switch is installed at point B, one less switch is needed, which has the effect of reducing unit costs.

Figure 5:
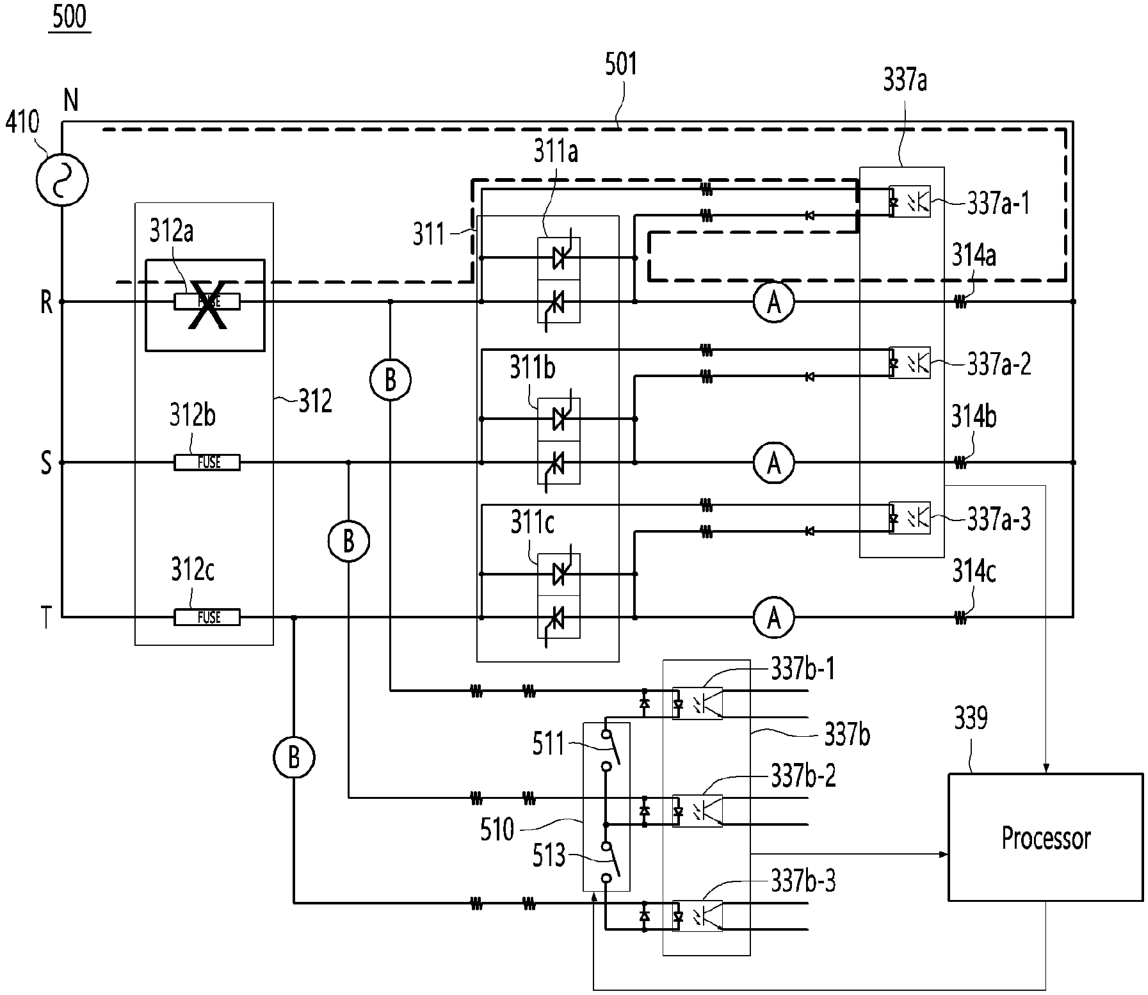
FIG. 5 is a circuit diagram for describing the configuration of a power regulator according to another embodiment of the present invention.

FIG. 5 is a circuit diagram for describing the configuration of a power regulator according to another embodiment of the present invention.

Referring to FIG. 5, a power regulator 500 may further include a switch unit 510 corresponding to point C in FIG. 4 in addition to the components shown in FIG. 4.

The switch unit 510 may include a first switch 511 and a second switch 513.

Each of the first switch 511 and the second switch 513 may be a high-voltage switch capable of withstanding up to 440 Volts.

The first switch 511 may be disposed between the fourth photo coupler 337*b*-1 and the fifth photo coupler 337*b*-2.

The second switch 513 may be disposed between the fifth photo coupler 337*b*-2 and the sixth photo coupler 337*b*-3.

The processor 339 may receive a user input through the display unit 335 or a separate user input unit (not shown) and generate a switch-on signal or a switch-off signal according to the received user input.

The switch-on signal may be a signal for turning on (short-circuiting) the first switch 511 and the second switch 513.

The switch-off signal may be a signal for turning off (opening) the first switch 511 and the second switch 513.

The processor 339 may control the operation of the switch unit 510 by transmitting the generated switch-on signal or switch-off signal to the switch unit 510.

The processor 339 may turn on (short-circuit) the first switch 511 and the second switch 513 in the three-phase zero crossing detection mode.

The processor 339 may turn off (open) the first switch 511 and the second switch 513 in the single-phase zero crossing detection mode.

In the single-phase zero crossing detection mode, as the first switch 511 and the second switch 513 are turned off (opened), the single-phase zero crossing detection unit 337*a* and the three-phase zero crossing detection unit 337*b* may be physically insolated. Accordingly, frequency measurement error for signals output from each zero crossing detection unit may be fundamentally prevented.

Meanwhile, as the first switch 511 and the second switch 513 are opened, the existing current loop 411 may be changed to a new current loop 501.

When the R-phase fuse 312*a* is blown, the processor 339 cannot receive a low-voltage digital signal from the first photo coupler 337*a*-1. In this case, the processor 339 may determine that an abnormality has occurred in the R-phase fuse 312*a*.

The processor 339 may output an abnormality alarm for the R-phase fuse 312*a* through the display unit 335 or transmit the abnormality alarm for the R-phase fuse 312*a* to an external device (PC).

As described above, according to the embodiment of the present invention, the power regulator 500 implemented as a single-phase/three-phase integrated circuit for zero crossing detection may accurately detect fuse blowing in the single-phase zero crossing detection mode and provide abnormality notification related to the fuse blowing.

Therefore, a manager may quickly recognize a fuse blowing and take immediate action.

Figure 6:
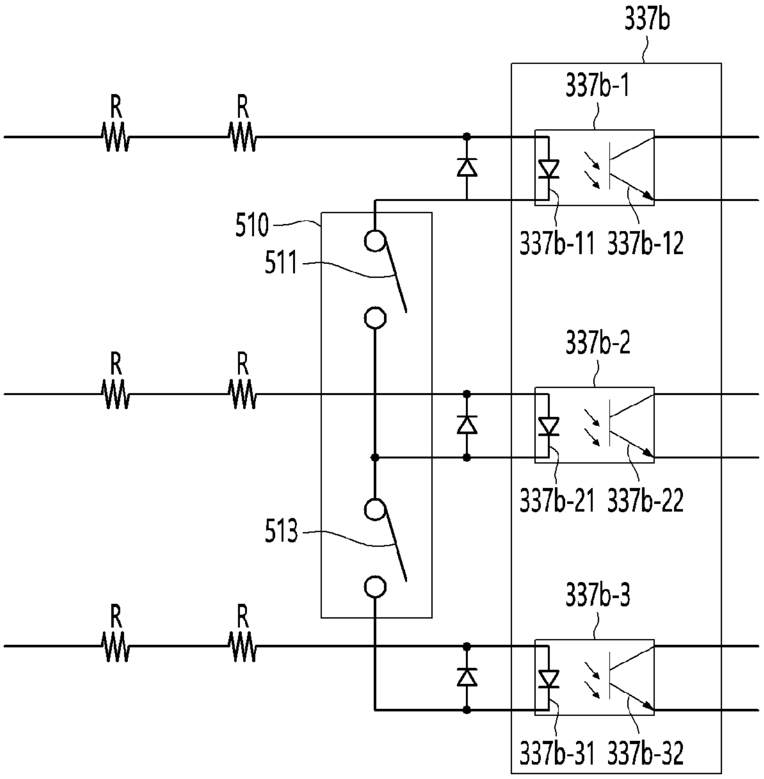
FIG. 6 is a diagram illustrating the connection relationship between the switch unit and the three-phase zero crossing detection unit according to the embodiment of FIG. 5.

FIG. 6 is a diagram illustrating the connection relationship between the switch unit and the three-phase zero crossing detection unit according to the embodiment of FIG. 5.

Referring to FIG. 5, the fourth photo coupler 337*b*-1 may include a fourth diode 337*b*-11 and a fourth transistor 337*b*-12, and the fifth photo coupler 337*b*-2 may include a fifth diode 337*b*-21 and a fifth transistor 337*b*-22, and the sixth photo coupler 337*b*-3 may include a sixth diode 337*b*-31 and a sixth transistor 337*b*-32.

One end of the first switch 511 may be connected to the cathode terminal of the fourth diode 337*b*-11, and the other end of the first switch 513 may be connected to the cathode terminal of the fifth diode 337*b*-21.

One end of the second switch 513 may be connected to the other end of the first switch 511 and the cathode terminal of the fifth diode 337*b*-21.

The other end of the second switch 513 may be connected to the cathode terminal of the sixth diode 337*b*-31.

Figure 7:
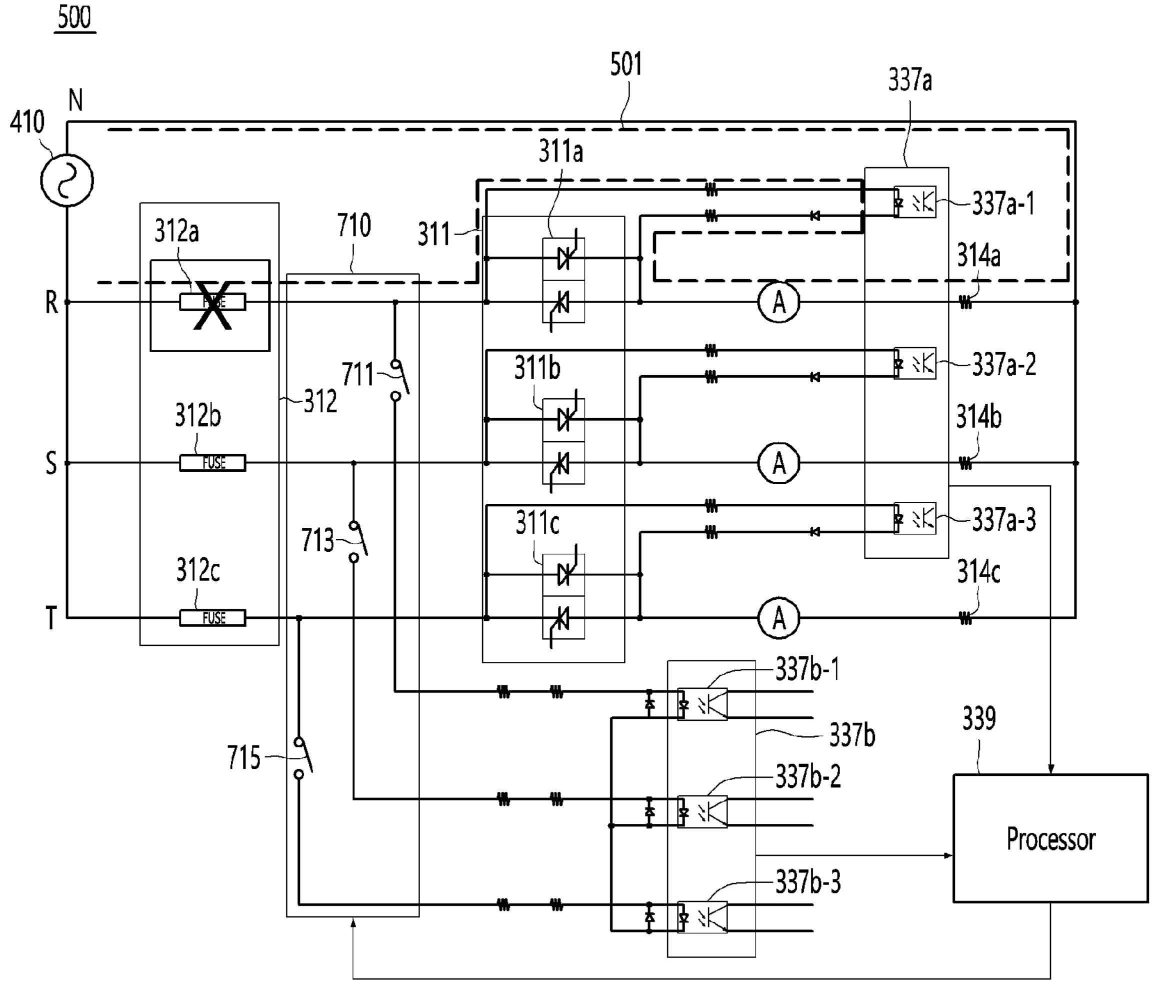
FIG. 7 is a circuit diagram for describing the configuration of a power regulator according to another embodiment of the present invention.

FIG. 7 is a circuit diagram for describing the configuration of a power regulator according to another embodiment of the present invention.

The power regulator 700 of FIG. 7 may include a switch unit 710 corresponding to point B of FIG. 4 in addition to the components of FIG. 4.

The switch unit 710 may include a first switch 711, a second switch 713, and a third switch 715.

Each of the first switch 711, the second switch 713, and the third switch 715 may be a high-voltage switch capable of withstanding up to 440 Volts.

One end of the first switch 711 may be connected to one end of the R-phase fuse 312*a* and one end of the first SCR 311*a*.

The other end of the first switch 711 may be connected to the anode terminal of the fourth diode 337*b*-11.

One end of the second switch 713 may be connected to one end of the S-phase fuse 312*b* and one end of the second SCR 311*b*.

The other end of the second switch 713 may be connected to the anode terminal of the fifth diode 337*b*-21.

One end of the third switch 715 may be connected to one end of the T-phase fuse 312*c* and one end of the third SCR 311*c*.

The other end of the third switch 715 may be connected to the anode terminal of the sixth diode 337*b*-31.

The processor 339 may receive a user input through the display unit 335 or a separate user input unit (not shown) and generate a switch-on signal or a switch-off signal according to the received user input.

The processor 339 may generate a switch-on signal or a switch-off signal according to the set detection mode.

The switch-on signal may be a signal for turning on (short-circuiting) the first switch 511 and the second switch 513.

The switch-off signal may be a signal for turning off (opening) the first to third switches 711 to 715.

The processor 339 may control the operation of the switch unit 710 by transmitting the generated switch-on signal or switch-off signal to the switch unit 710.

The processor 339 may turn on (short-circuit) the first to third switches 711 to 715 in the three-phase zero crossing detection mode.

The processor 339 may turn off (open) the first to third switches 711 to 715 in the single-phase zero crossing detection mode.

In the single-phase zero crossing detection mode, as the first to third switches 711 to 715 are turned off (opened), the single-phase zero crossing detection unit 337*a* and the three-phase zero crossing detection unit 337*b* may be physically isolated. Accordingly, frequency measurement error for signals output from each zero crossing detection unit may be fundamentally prevented.

Meanwhile, as the first to third switches 711 to 715 are opened, the existing current loop 411 may be changed to a new current loop 501.

When the R-phase fuse 312*a* is blown, the processor 339 cannot receive a low-voltage digital signal from the first photo coupler 337*a*-1. In this case, the processor 339 may determine that an abnormality has occurred in the R-phase fuse 312*a*.

The processor 339 may output an abnormality alarm for the R-phase fuse 312*a* through the display unit 335 or transmit the abnormality alarm for the R-phase fuse 312*a* to an external device (PC).

As described above, according to the embodiment of the present invention, the power regulator 700 implemented as a single-phase/three-phase integrated circuit for zero crossing detection may accurately detect fuse blowing in the e single-phase zero crossing detection mode and provide abnormality notification related to the fuse blowing.

Therefore, the manager may quickly recognize a fuse blowingt and take immediate action.

The processor 339 may turn on (short-circuit) the first to third switches 711 to 715 in the three-phase zero crossing detection mode.

According to an embodiment of the present disclosure, the above-described method may be implemented with codes readable by a processor on a medium in which a program is recorded. Examples of the medium readable by the processor include a ROM (Read Only Memory), a Random Access Memory (RAM), a CD-ROM, a magnetic tape, a floppy disk, an optical data storage device, and the like.

The display device as described above is not limited to the configuration and method of the above-described embodiments, but the embodiments may be configured by selectively combining all or part of each embodiment such that various modifications can be made.

The invention claimed is:

1. A power regulator comprising:

a fuse module which includes a first fuse, a second fuse and a third fuse;

a thyristor module which includes a first thyristor, a second thyristor and a third thyristor and controls power supplied to a load;

a single-phase zero crossing detection unit which includes a first photocoupler, a second photocoupler and a third photocoupler;

a three-phase zero crossing detection unit which includes a fourth photocoupler, a fifth photocoupler and a sixth photocoupler; and a switch unit which physically insulates the single-phase zero crossing detection unit and the three-phase zero crossing detection unit from each other.

2. The power regulator of claim 1, wherein the switch unit is turned off in a single-phase zero crossing detection mode in which a single-phase zero crossing is detected, and turned on in a three-phase zero crossing detection mode in which a three-phase zero crossing is detected.

3. The power regulator of claim 2, wherein the switch unit includes a first switch and a second switch, wherein one end of the first switch is connected to a cathode terminal of a diode included in the fourth photocoupler, and another end of the first switch is connected to a cathode terminal of a diode included in the fifth photocoupler, and wherein one end of the second switch is connected to the cathode terminal of the diode included in the fifth photocoupler, and another end of the second switch is connected to a cathode terminal of a diode included in the sixth photocoupler.

4. The power regulator of claim 2, wherein the switch unit includes a first switch, a second switch and a third switch, wherein one end of the first switch is connected to one end of the first fuse and one end of the first thyristor, and another end of the first switch is connected to an anode terminal of a diode included in the fourth photocoupler, wherein one end of the second switch is connected to one end of the second fuse and one end of the second thyristor, and another end of the second switch is connected to an anode terminal of a diode included in the fifth photocoupler, and wherein one end of the third switch is connected to one end of the third fuse and one end of the third thyristor, and another end of the third switch is connected to an anode terminal of a diode included in the sixth photocoupler.

5. The power regulator of claim 2, further comprising:

a processor configured to control operation of the switch unit, wherein the processor is configured to transfer an off signal for turning off the operation of the switch unit or an on signal for turning on the operation of the switch unit, according to the single-phase zero crossing detection mode or the three-phase zero crossing detection mode.

6. The power regulator of claim 5, wherein each of the first photocoupler, the second photocoupler and the third photocoupler converts a single-phase high-voltage alternating current (AC) signal to a first low-voltage digital signal, and outputs the first low-voltage digital signal to the processor, wherein each of the fourth photocoupler, the fifth photocoupler and the sixth photocoupler converts a three-phase high-voltage alternating current signal to a second low-voltage digital signal, and outputs the second low-voltage digital signal to the processor, and wherein the processor is configured to detect the single-phase zero crossing based on the first low-voltage digital signal or the three-phase zero crossing based on the second low-voltage digital signal.

7. The power regulator of claim 2, further comprising:

a display unit configured to display an abnormality notification indicating that a short circuit has occurred in any of the first fuse, the second fuse and the third fuse in the single-phase zero crossing detection mode.

8. The power regulator of claim 2, further comprising:

an input power supply configured to provide input power wherein the switch unit includes a first switch, a second switch and a third switch, wherein one end of the first switch is connected to one end of the first thyristor, and another end of the first switch is connected to one end of an R-phase load, wherein one end of the second switch is connected to one end of the second thyristor, and another end of the second switch is connected to one end of an S-phase load, and wherein one end of the third switch is connected to one end of the third thyristor, and another end of the third switch is connected to a T-phase load.

* * * * *